United States Patent [19]
Yen

[11] Patent Number: 4,789,560
[45] Date of Patent: Dec. 6, 1988

[54] DIFFUSION STOP METHOD FOR FORMING SILICON OXIDE DURING THE FABRICATION OF IC DEVICES

[75] Inventor: Yung-Chau Yen, San Jose, Calif.

[73] Assignee: Advanced Micro Devices, Inc., Sunnyvale, Calif.

[21] Appl. No.: 817,233

[22] Filed: Jan. 8, 1986

[51] Int. Cl.$^4$ .................. B05D 5/12; C23C 16/40
[52] U.S. Cl. .................. 427/96; 357/23.1; 427/99; 427/255; 427/255.2; 427/255.3; 427/255.7; 437/67; 437/108; 437/238; 437/241
[58] Field of Search .......... 427/96, 99, 255, 86, 427/255.1, 255.2, 255.3, 255.4, 255.7, 402, 97, 94, 93; 29/571, 576 R, 576 T; 357/23.1, 23.8; 437/62, 233, 983, 67, 238, 241, 239, 108

[56] References Cited

U.S. PATENT DOCUMENTS

| | | | |
|---|---|---|---|
| 3,549,411 | 12/1970 | Bean et al. | 427/255 |
| 3,652,324 | 3/1972 | Chu et al. | 427/94 |
| 3,911,168 | 10/1975 | Schinella et al. | 427/94 |
| 4,001,465 | 1/1977 | Graul et al. | 427/94 |
| 4,230,745 | 10/1980 | Betz et al. | 427/255 |
| 4,254,161 | 3/1981 | Kenlage | 427/94 |
| 4,278,705 | 7/1981 | Agraz-Guerena et al. | 427/255 |
| 4,333,964 | 6/1982 | Ghezzo | 427/94 |
| 4,435,447 | 3/1984 | Ito et al. | 427/255 |
| 4,473,598 | 9/1984 | Ephrath et al. | 427/94 |
| 4,583,281 | 4/1986 | Ghezzo et al. | 427/94 |
| 4,597,159 | 7/1986 | Usami et al. | 427/99 |

FOREIGN PATENT DOCUMENTS

| | | | |
|---|---|---|---|
| 48-31034 | 5/1968 | Japan | 427/94 |

OTHER PUBLICATIONS

Bassous, "Fabricating Submicrometer Silicon Devices", IBM Tech. Disclosure Bulletin, vol. 15, No. 6, pp. 1823-1825, Nov. 1972.

Primary Examiner—Sadie L. Childs
Attorney, Agent, or Firm—Paul Hentzel; Mark Miller

[57] ABSTRACT

High quality silicon oxide is grown for integrated circuits by oxidizing poly-crystalline silicon under an oxygen gas flow. A diffusion stop layer of thermal silicon nitride is formed on the underlying substrate prior to the deposition of the poly layer to be oxidized. The nitride layer isolates the substrate from diffused oxygen within the poly layer during oxidation, permitting a non-critical, oxidation time. Extension of the oxidation period elimates extended imperfect or "loose" chemical bonds throughout the oxide layer formed. Corner stress common in trench applications is minimized because the nitride prevents oxidation in the substrate. The oxidation of undoped poly over doped poly proceeds conformally because the nitride layer therebetween inhibits the enhanced oxidation effect of impurities in the doped poly.

45 Claims, 6 Drawing Sheets

FIG. 3B
NITRIDE

DIFFUSION STOP METHOD FOR FORMING SILICON OXIDE DURING THE FABRICATION OF IC DEVICES

BACKGROUND OF THE INVENTION

1. Field of the Invention

This invention relates to forming silicon oxide from poly-crystalline silicon during the fabrication of integrated circuits, and more particularly to the use of silicon nitride as a diffusion stop.

2. Description of the Related Art

During the conventional oxidation step in IC fabrication, silicon material (either single crystal or poly-crystalline) is converted to silicon oxide insulation material by exposure to oxygen at elevated temperatures. Oxygen reacts with the surface silicon forming silicon oxide (oxide). The oxygen diffuses through this oxide to form more oxide. The silicon is progressively oxidized from the surface inward.

An oxide/silicon interface exists between the oxide and the silicon. The interface defines the furthest extent of the oxygen diffusion and oxidation into the interior of the silicon, and therefore is generally oxygen "poor". The limited oxygen condition results in partially oxidized silicon and imperfect oxidation bonds proximate the interface. The interface advances into the silicon as the oxidation step proceeds in the conventional fabrication, and is present in the finished conventional device. The incomplete oxidation results in "loose chemical bonds" which support leakage and breakdown paths during the operation of the device.

The conventional oxidation technique does not employ the present silicon nitride diffusion stop. The extent of the silicon to oxide conversion is therefore time and temperature dependent. If the oxidation step is too short or the temperature too low, the resulting oxide layer is thinner than expected. If the oxidation step is too long or the temperature too high, the resulting oxide layer is thicker than expected.

The conventional oxidation of single crystal silicon material (wafers) has additional problems which are overcome by the present nitride diffusion stop. The dopant concentration within the substance portion of each wafer varies slightly from wafer to wafer. The oxidation rate of the substrate silicon is dependent on this dopant concentration, resulting in a non-uniform oxide thickness from wafer to wafer. Wafers with a higher dopant concentration will undergo more oxide conversion than lower dopant wafers during the same oxidation time period. The substrate oxide will be thicker on these higher dopant wafers. The oxide thickness variation is caused by concentration variances, and is present even if the time and temperature conditions remain constant.

The conventional oxidation of poly-crystalline silicon material (poly) also has additional problems which are overcome by the present nitride diffusion stop. Grain boundaries within the poly accumulate impurities which enhance the local oxidation rate. The resulting oxide is "non-conformal" with the underlying poly. The poly to oxide conversion is greater over each grain boundary because of the enhanced oxidation. The grain boundary regions produce a thicker oxide. The poly to oxide conversion is less over each grain body where the local oxidation rate is not enhanced. The resulting thin oxide regions over the grain bodies are subject to electrical breakdown during operation.

This non-conformal problem is less significant at higher oxidation temperatures (1100 degrees C.). Both grain boundary regions and grain body regions produce oxide at a much faster rate; reducing the boundary oxidation differential. However, at higher temperatures, dopant redistribution by thermal diffusion lowers the performance of the device.

Conventional oxidation techniques for trenches results in "corner stress" in the substrate silicon. The poly expands to over twice its original volume as the oxide is formed. Trench corners have congested geometries which do not permit oxide expansion as readily the flat walls of the trench. The resulting expansion stress is transmitted to the substrate, preceeding the advancing oxide.

SUMMARY OF THE INVENTION

It is therefore an object of this invention to provide a method of forming an improved silicon oxide insulator layer by using a silicon nitride diffusion stop.

It is a further object of this invention to provide such a method of forming an oxide insulator layer having a thickness which is not critically dependent on either time or temperature.

It is a further object of this invention to provide such a method of forming an oxide insulator layer in which control of the oxidation environment is less critical.

It is a further object of this invention to provide such a method of forming an oxide insulator layer in which the oxidation period may be extended.

It is a further object of this invention to provide such a method of forming an oxide insulator layer at a lower temperature during oxidation.

It is a further object of this invention to provide such a method of forming an oxide insulator layer with minimum dopant redistribution.

It is a further object of this invention to provide such a method of forming an oxide insulator layer with less impurity out diffusion and boundary dopant segregation.

It is further object of this invention to provide such a silicon oxide insulator material which is completely oxidized with minimum imperfect chemical bonds.

It is further object of this invention to provide such a silicon oxide insulator material on single crystal silicon.

It is further object of this invention to provide such a silicon oxide insulator material on polycrystalline silicon.

It is further object of this invention to provide such a silicon oxide insulator material in a trench with minimum corner stress in the substrate.

It is further object of this invention to provide such a silicon oxide material as a etch stop during the fabrication of isolation trenches.

It is further object of this invention to provide such a silicon oxide insulator material as a dielectric in capacative storage trenches.

It is further object of this invention to provide such a silicon oxide insulator material to form the dielectric material in a floating gate device.

Briefly, these and other objects of the present invention are accomplished by providing a silicon nitride layer on a host support, and depositing polysilicon thereover. The poly is oxidized by elevating the temperature of the poly and exposing the poly to oxygen. The oxygen diffuses through the silicon oxide to progressively oxidize the poly. The nitride prevents diffusion of the oxygen into the host support. The oxidation is continued until the oxide-silicon interface reaches the nitride causing the poly to merge into the oxide. The oxidation process is driven to completion for converting essentially all of the poly into oxide, and saturated to perfect loose chemical bonds.

Other object, features and advantages of the present invention will become apparent upon consideration of the following detailed description and the accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 1-A to 1-G illustrate the steps of a general diffusion stop method for forming a silicon oxide layer;

FIGS. 3-A to 3-D and 3-E to 3-G show an isolation trench embodiment of the method of FIG. 1;

DETAILED DESCRIPTION OF THE INVENTION

Figure 3A:
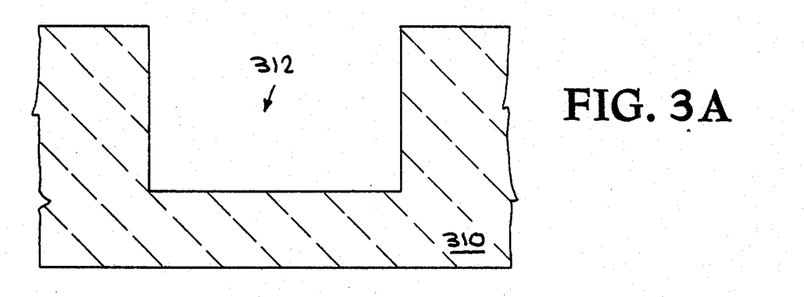
Figure 3B:
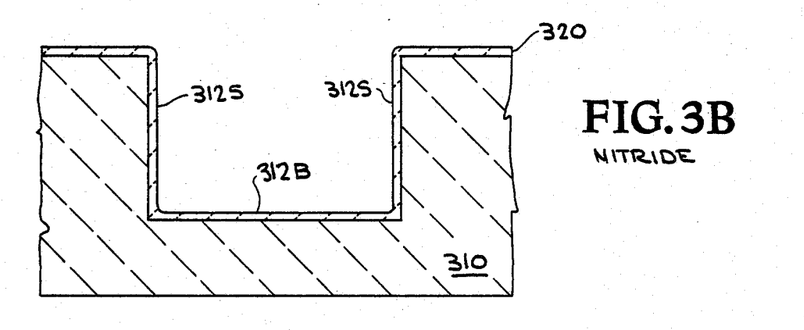
Figure 3C:
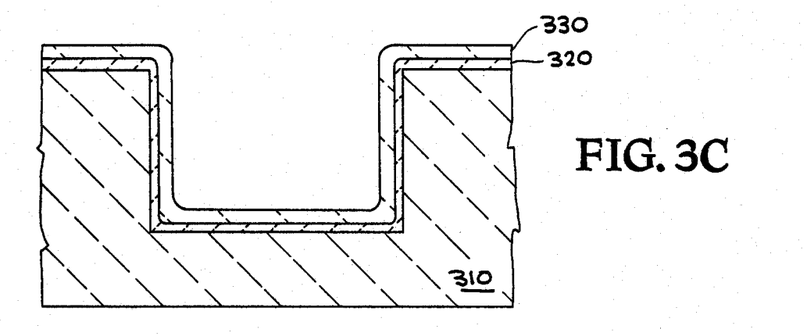
Figure 3D:
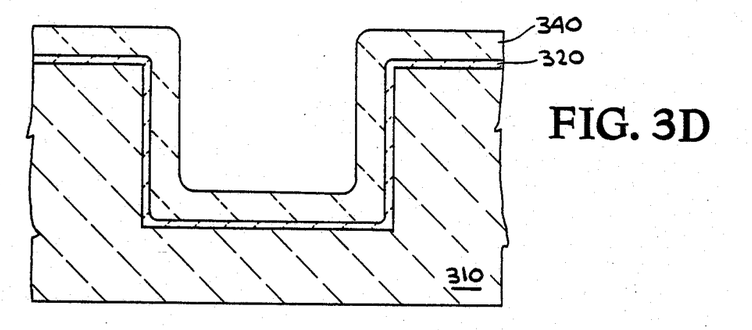
Figure 3E:
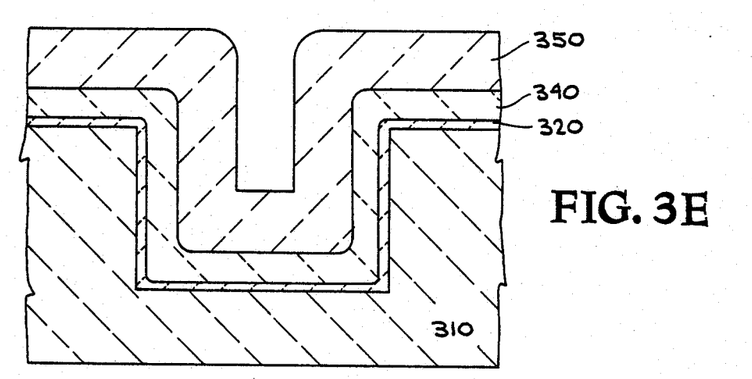
Figure 3F:
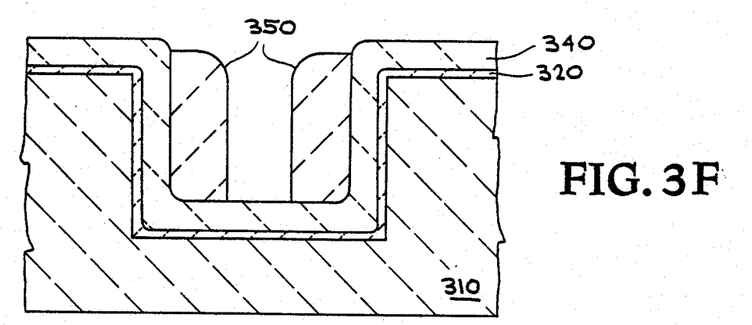
Figure 3G:
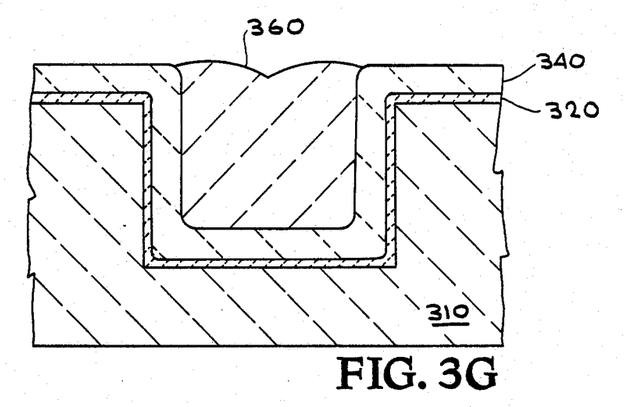
Figure 4:
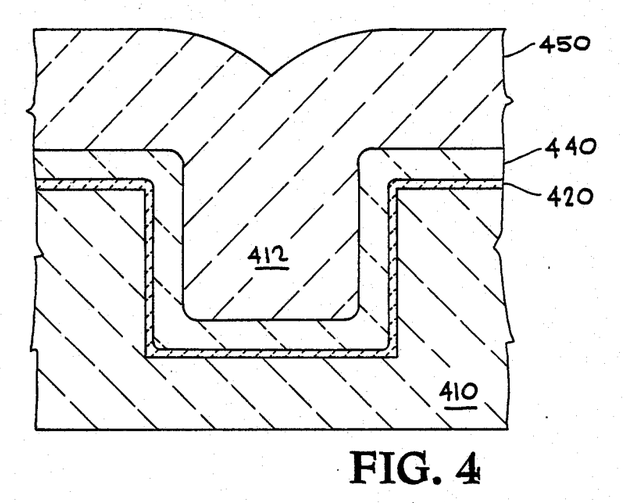
FIG. 4 shows a storage capacitor trench embodiment of the method of FIG. 1.
Figure 5:
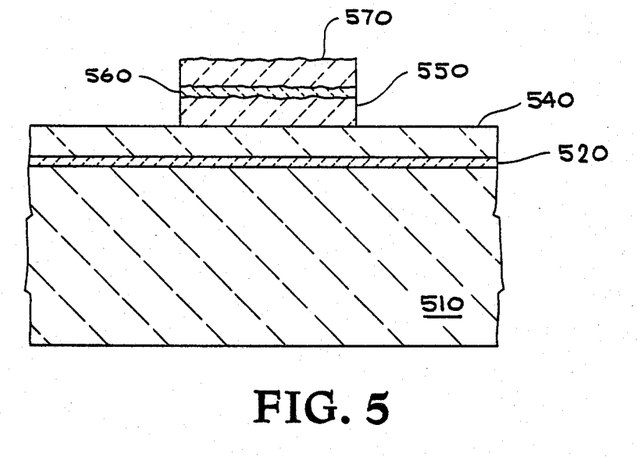
FIG. 5 shows a floating gate embodiment of the method of FIG. 1.

Reference is made now in detail to a general embodiment of the present invention (FIG. 1), which illustrates the best mode presently contemplated by the inventor for practicing the invention. Alternative embodiments are also briefly described as applicable (FIGS. 3, 4, and 5).

GENERAL METHOD—FABRICATION DIAGRAM (FIG. 1)

A general method of growing high quality silicon oxide using a silicon nitride diffusion stop is described in STEPS 1-A to 1-G below and shown in corresponding FIGS. 1-A through 1-G.

STEP (1-A) Providing a suitable support host 110 for the silicon nitride diffusion stop 120 and oxide layer 140 and the remainder of the fabricated device 150. Support host 110 may be a single crystal silicon substrate (as shown in FIG. 1) or poly-crystalline silicon formed latter in the fabrication (as shown in FIG. 5 ). Silicon substrate 110 may contain dopants at various concentrations to establish conductivity regions forming elements of the fabricated device.

Figure 1A:
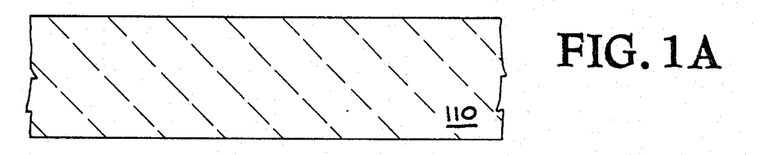
Figure 1B:
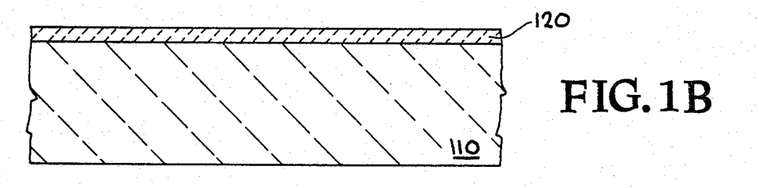

STEP (1-B) Forming a silicon nitride layer 120 over support host 110. Nitride layer 120 may be generated by a suitable technique such as growing thermal nitride on silicon 110 by decomposing a nitrogen bearing gas flow such as ammonia.

Figure 1C:
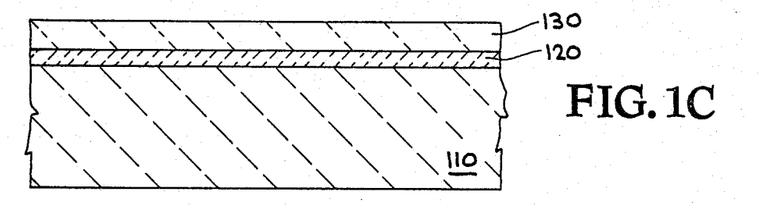

STEP (1-C) Forming poly-crystalline silicon layer 130 over nitride 120 by conventional LPCVD (low pressure chemical vapor deposition). Amorphous (small grained) silicon material formed at low deposition temperatures (less then 600 degrees Centigrade) is preferred. Small grains provide a smoother, more homogeneous layer with fewer structural defects. Poly 130 is deposited from the surface outward, and therefore has a thickness which is time and temperature dependent.

Figure 1D:
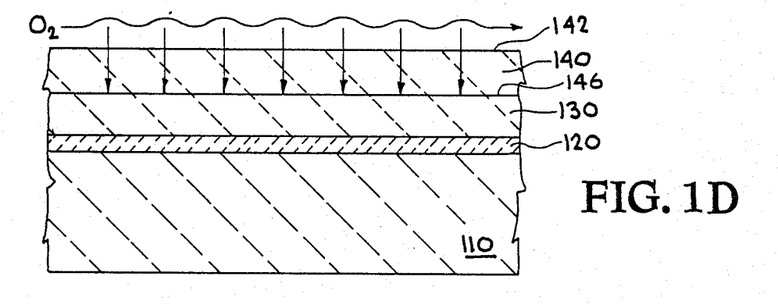

STEP (1-D) Oxidizing poly 130 forming outer oxide layer 140 by elevating the temperature sufficient to support the oxidation reaction between silicon and oxygen and sufficient to permit oxygen diffusion through oxide 140, while simultaneously exposing poly 130 to an oxygen bearing gas flow such as steam or dry oxygen. The formation of oxide 140 advances inward from outer surface 142 toward nitride 120 as oxygen diffuses through oxide 140. The oxygen poor condition along oxide-silicon interface 146 causes incomplete oxidation along the leading edge of growing oxide 140. The advance rate of oxide 140 into poly 130 is determined primarily by the rapid diffusion rate of oxygen through the increasing silicon oxide of oxide 140.

Figure 1E:
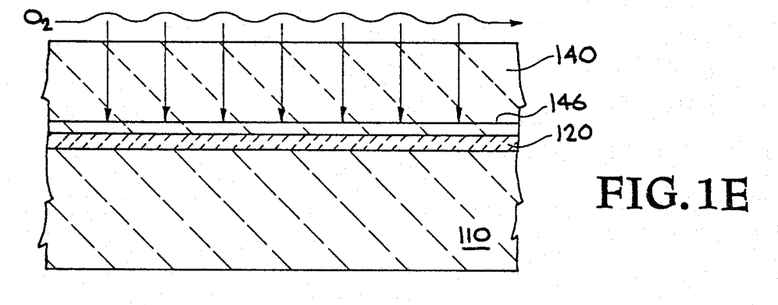

STEP (1-E) Continuing the oxidation of poly 130 until oxide-silicon interface 146 reaches nitride 120 causing poly 130 to completely merge into oxide 140. Essentially all of the poly in layer 130 is converted into oxide 140. Interface 146 encounters diffusion stop nitride 120 as shown in FIG. 1-E. At this point nitride 120 impedes the oxide advance to a virtual standstill for the normal time frames involved in IC fabrication. Oxygen has a very slow diffusion rate into silicon nitride as compared with silicon oxide.

Figure 1F:
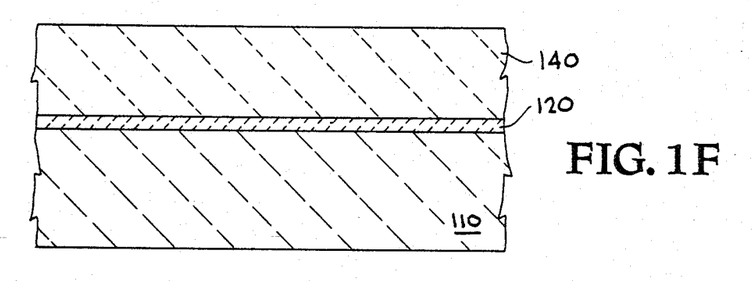
Figure 1G:
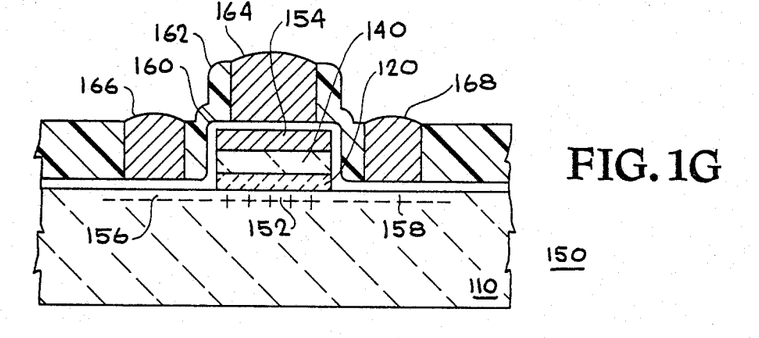

STEP (1-F-1) Driving the oxidation of oxide 140 further to eliminate the partial oxidation states, by continuing the simultaneous temperature and exposure conditions of STEPS 1-D and 1-E. Nitride 120 prevents interface 146 from advancing, while oxygen continues to diffuse into the oxygen poor interior of oxide 140. The oxygen level increases throughout oxide layer 140, eliminating partial oxidation states.

STEP (1-F-2) Saturating the oxidation within oxide layer 140 to perfect "loose" chemical bonds by continuing the simultaneous temperature and exposure conditions of STEPS 1-D, 1-E, and 1-F-1). The chemical bonds between the silicon and the oxygen throughout oxide 140 develope reducing the imperfect bond population. The resulting oxide material is high quality with excellent dielectric insulative properties.

Nitride diffusion stop layer 120 prevents the diffused oxygen within oxide 140 from reaching substrate 110 during final STEPS 1-E, 1-F-1, and and 1-F-2. The oxidation of nitride is extremely slow as compared to the oxidation of poly. A very thin nitride layer 120 can protect substrate 110 for several hours at oxidation temperatures. The exposure of nitride 120 to oxygen does not start until interface 146 reaches nitride 120 in STEP 1-E. Nitride 120 also minimizes the out diffusion of substrate dopant into poly 130 and oxide 140 during the elevated temperature STEPS 1-D, 1-E, 1-F-1 and 1-F-2. In addition, nitride 120 inhibits boundary segregation of substrate impurities into poly 130.

STEP (1-G) Completing the fabrication process to obtain an operating device such as transistor 150 (shown in FIG. 1-G). Gate region 152 is implanted in substrate 110 with boron through channels formed by photoresist. Doped poly is deposited on oxide 140 over gate region 152 forming gate electrode 154. The doped poly and oxide 140 and nitride 120 are etched away defining source region 156 and drain region 158. Thin blanket poly 160 is formed, and source 156 and drain 158 are implanted with N type dopant. A thermal cycle is exercised for driving the dopant into substrate 110 and to oxidize blanket poly 160. Blanket glass 162 (P doped) is formed and opened at gate 154, source 156, and drain 158. Metal is deposited into the openings forming gate contact 164, source contact 166, and drain contact 168.

FORMATION OF THERMAL NITRIDE (FIG. 2)

Thermal nitride may be grown on host 110 during STEP 1-B by passing ammonia gas over the host at elevated temperatures. Nitrogen from the gas reacts with surface silicon on host 110 to form the surface of nitride 120. The interior of nitride 120 is formed by nitrogen diffusing through the surface and reacting with interior silicon. The growing edge of nitride 120 is from the surface to the interior, and requires diffused nitrogen to advance. As the growing nitride 120 becomes thicker, the supply of diffused nitrogen from the surface decreases. The nitride growth eventually slows to almost zero as shown in the FIG. 2 chart of temperature curves (layer thickness verses time of exposure at selected temperatures). Thermal nitride growth process is self-limiting in thickness. The final thickness depends almost entirely on the growth temperature of the nitride, and is practically independent of time.

Figure 2:
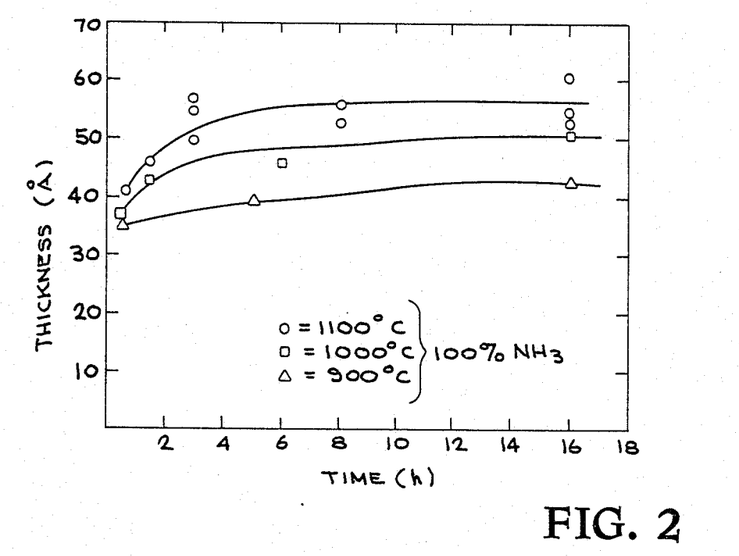
FIG. 2 is a family of temperature curves showing the self limiting property of silicon nitride growth.

Nitride layers as thin as 20 Angstroms may be obtained at low growth temperatures. Thin diffusion stop layers are preferred in oxide formation applications to reduce the capacitance and related transient effects. The theoretical lower limit on nitride thickness is determined by the minimum temperature at which the silicon-nitrogen reaction will proceed, subject to substrate native oxide considerations. Thicker nitride layers of from about 20 to about 50 Angstroms may be obtained over a growth temperature range of from about 800 to about 1200 degress Centigrade. The theoretical upper limit on nitride thickness is determined by temperature limitations inherent in fabrication techniques and equipment, subject to the melting point of silicon nitride.

Extending the nitride growth period into the flat "low growth" region of the growth curve eliminates the effect of time on the layer thickness, and insures thickness uniformity throughout the nitride. Initial nitride regions that are thinner than the adjacent nitride have a higher diffused oxygen flow. These thin regions grow faster and catch up with the thicker adjacent nitride. All of the regions cease growing at the same temperature dependent thickness regardless of initial differences in growth rate.

Nitride is sensitive to gas impurities, which degrade the dielectric properties of the nitride layer. However in device 150, oxide layer 140 provides the dielectric insulation. Nitride 120 provides a barrier to oxygen in diffusion and impurity out diffusion. Gas impurties on these physical properties of nitride is insignificant.

NON-CRITICAL OXIDATION ENVIRONMENT

Nitride layer 120 provides an oxygen diffusion stop which protects substrate 110 from oxidation. The oxidation period includes "oxidation", "driving" and "saturation" (STEPS 1-D, 1-E, 1-F-1, and 1-F-2); and may be extended well beyond saturation without ill effect. The length of the oxidation time period in "non-critical" as long as sufficient time is provided for saturation. The post saturation period remaining after saturation is non-determinative. The oxidation temperature is similarly non-critical. Higher temperatures advance the oxide process faster, resulting in a longer post saturation period. Lower oxidation temperatures slow the oxidation rate, resulting in a shorter post saturation period. Heretofore, the oxidation period was initiated and terminated during the constant temperature portion of the furnace cycle (the main period) in order to maintain the critical oxidation environment. In conventional oxidation, the time and temperature was highly critical. Because of the stopping power of nitride 120, oxidation conditions are no longer so critical. The oxidation period may begin as the temperature is rising (during the ramp-up period), and terminated as the temperature is falling (during the ramp-down period). The main period may be shortened because of the use of the ramp periods to conserve heat.

BEST MODE GENERAL METHOD

The following particulars are given as an illustrative example of forming oxide layer 140 using the general diffusion stop method of FIG. 1.

Host 110: Single crystal silicon substrate about 10–15 mils thick (1.00) doped at about $5 \times 10$ to the 15th Nitride 120: thermal silicon nitride about 30 Angstroms thick formed by decomposition of pure ammonia for about 60 minutes at about 900 degrees C.

Silicon 130: Poly-crystalline silicon amorphous structure about 200 Angstroms thick formed by LPCVD for about 6 minutes at about 580 degrees C.

Oxide 140: Silicon oxide $200 \times 2.25 = 450$ Angstroms thick formed by diffusion oxidation for about 25 to 30 minutes at about 900 to 1100 degrees C., respectively, including driving and saturation.

The temperatures, times and dimensions given above are approximate, and are not intended to define the limitations of the invention. Numerous other applications and configurations are possible.

Detailed information concerning IC fabrication is available in a publication entitled "Semiconductor & Integrated Cirucits Fabrication Techniques" by Reston PUblishing Co., Inc. Copyright 1979 Fairchild Corporation; which publication is hereby incorporated by reference in its entirety into this disclosure.

TRENCH EMBODIMENT (FIG. 3)

The specific oxidation methods 3 and 4 (shown in corresponding FIGS. 3A-G and 4) have special application to the formation of stress free substrates for oxide layers in isolation trenches and storage capacitor trenches. Heretofore, the volume expansion involved in the poly to oxide conversion (without a nitride layer) generated corner stress along both 90 degree bottom corners and along both 270 degree upper corners. The present nitride layer prevents oxygen from reaching the substrate, eliminating all direct substrate stress due to oxide expansion. The nitride stop layer defines a boundary which permits the oxidation process to continue without increasing the oxide thickness. The poly to becomes completely oxidized minimizing the "corner stress" heretofore associated with trench oxide. Without, a nitride stop layer between the substrate silicon and the poly, corner stress continued to develope as the oxidation conversion advanced into the substrate.

The direct expansion stress in the oxide formed over the nitride is limited by the thinness of the oxide layer. Even in thicker oxide layers, the underlying poly acts as a temporary buffer layer between the increasing oxide layer and the substrate. As the last of the underlying poly is converted into oxide, the overlying oxide has lost significant stress due to the oxidation temperature. This reduced stress remaining in the oxide layer is too small to be induced into the substrate through the nitride as indirect stress.

ISOLATION TRENCH - FABRICATION DIAGRAM

(FIG. 3)

A specific method of growing high quality silicon oxide over substrate isolation trenches using a silicon nitride diffusion stop is described in STEPS 3-A to 3-I below and shown in corresponding FIGS. 3-A to 3-G STEP (3-A-1) Providing a suitable single crystal silicon support host 310 for the trench and the remainder of the fabricated device (similar to STEP 1-A).

STEP (3-A-2) Providing a trench 312 in substrate 310 by masking followed by a suitable etching technique such as reactive ion etching (RIE).

STEP (3-B) Forming a silicon nitride layer 320 over support host 310 (similar to STEP 1-B). In isolation trench applications, the nitride thickness may be selected from a wide range. Nitride 320 functions primarily as a diffusion stop. A very thin 20 Angstrom layer is functional and a thicker 50 Angstrom layer is also functional. For deep narrow trenches, the upper portion of trench sidewalls 312S have better exposure to the ammonia gas then the lower portion of the sidewalls and bottom wall 312B. The nitride deposits faster on the upper sidewalls, which are initially thicker. However, due to the self limiting feature of thermal nitride formation, the slower forming lower regions of the trench catch up. The upper regions reach the maximum thickness first and stabilize. The lower regions continue to grow until they stabilize at the same temperature determined thickness as the upper regions. The nitride forming STEP 3-B may be extended to insure uniform nitride thickness via this self limiting thickness characteristic.

STEP (3-C) Forming poly-crystalline silicon layer 330 over nitride 320 by conventional deposition (similar to STEP 1-C). For isolation trench applications, poly 330 functions as an etch stop in STEP 3-F, as well as a diffusion stop in the oxidation steps. Poly 330 and may be selected from a wide range of thicknesses. A resulting oxide having a thickness of 200-300 Anstroms is suitable for typical etch stop situations.

STEP (3-D-1) Oxidizing poly 330 forming outer oxide layer 340 by elevating the temperature sufficient to support the oxidation reaction between silicon and oxygen and to permit oxygen diffusion through oxide 340, while simultaneosuly exposing poly 330 to an oxygen bearing gas flow (similar to STEP 1-D).

STEP (3-D-2) Continuing the oxidation of poly 330 until oxide-silicon interface 346 reaches nitride 320 (similar to STEP 1-E).

STEP (3-D-3) Driving the oxidation of oxide 340 further to eliminate the partial oxidation states (similar to STEP 1-F-1).

STEP (3-D-4) Saturating the oxidation within oxide layer 340 to eliminate imperfect "loose" bonds (similar to STEP 1-F-2). During the oxidation STEPS 3-D-1, 3-D-4 the thermal conditions promote corner stress reduction as well as improving the chemical bonding.

STEP (3-E) Forming undoped poly 350 over oxide 340 having a thickness sufficient to fill trench 312 after oxidation. Because of the volume increase caused by oxidation conversion, poly 350 is typically ¼ the width of trench 312. For a trench width of 10,000 Angstroms (one micron), a suitable poly thickness is about 250 Angstroms (minus the thickness of nitride 320 and oxide 340 if significant).

STEP (3-F) Removing poly 350 from oxide 340 over substrate 310 and over trench bottom 312B, by a suitable directional etching technique such as RIE.

STEP (3-G) Oxidizing poly 350 forming outer oxide fill 360 in trench 312 by elevated temperature and oxygen exposure conditions (similar to STEP 3-D). The oxide expansion of poly 350 is outward from flat sidewalls 312S, and does not generate corner stress.

STEP (3-J) Continuing the oxidation of poly 350 until the oxide-silicon interface reaches oxide 340 (similar to STEP 1-E).

STEP (3-K-1) Driving the oxidation of oxide 350 further to eliminate the partial oxidation states (similar to STEP 1-F-1).

STEP (3-K-2) Saturating the oxidation within oxide layer 350 to eliminate imperfect "loose" bonds (similar to STEP 3-D-4). During the second oxidation of STEPS 3-G, 3-J, 3-K-1, and 3-K-2, nitride 320 prevents oxygen diffusion into substrate 310 just as in the first oxidation.

CAPACITIVE TRENCH - FABRICATION DIAGRAM

(FIG. 4)

A specific method of growing high quality silicon oxide over storage capacitors trenches is described in STEPS 4-A to 4-G below and shown in corresponding FIG. 4-G (plus FIGS. 3-A to 3-D).

STEP (4-A-1) Providing a suitable single crystal silicon support host 410 (similar to STEP 3-A).

STEP (4-A-2) Providing a trench 412 by masking and etching (similar to STEP 3-A-2).

STEP (4-B) Forming a silicon nitride layer 420 over support host 410 (similar to STEP 3-B). In capacitive trench applications, nitride 420 functions as the diffusion stop during fabrication, and as a portion of the capacitor dielectric during operation. Nitride 420 and and oxide layer 440 combine dielectric properties to form the capacitor being fabricated. Silicon nitride has a higher dielectric constant than silicon oxide. A higher value capacitor can be fabricated within the alloted substrate space if nitride layer 420 is more than the minimum thickness required for diffusion stop. A nitride 420 thickness of about 300 Angstroms is suitable for enhancing the capacitance.

STEP (4-C) Forming poly-crystalline silicon layer 430 over nitride 420 by conventional deposition (similar to STEP 3-C). Poly 430 functions as a capacitor dielectric material, and may be selected from a wide range of thicknesses. Thicknesses of from about 500 Angstroms to about 1,000 Angstroms are suitable for typical IC capacitors.

STEP (4-D) Oxidizing poly 430 forming outer oxide layer 440 by elevated temperature and oxygen exposure conditions (similar to STEP 3-D).

STEP (4-E) Continuing the oxidation of poly 430 until oxide-silicon interface 446 reaches nitride 420 (similar to STEP 3-E).

STEP (4-F-1) Driving the oxidation of oxide 440 further to eliminate the partial oxidation states (similar to STEP 3-F-1).

STEP (4-F-2) Saturating the oxidation within oxide layer 440 to eliminate imperfect "loose" bonds (similar to STEP 1-F-2).

STEP (4-G) Forming doped poly 450 over oxide 440 filling trench 412 to form one electrode of the capacitor which cooperates with the substrate electrode through oxide 440.

GATE EMBODIMENT (FIG. 5)

The specific oxidation method 5 (shown in corresponding FIGS. 1-A to 1-F and 5) have special application to the formation of floating gate devices. The insulator between the substrate and the floating gate (the first oxide) is formed by STEPS 1-A to 1-F of FIG. 1. The floating gate material is formed on the first oxide. Nitride is formed on the floating gate, and the insulator between the gate and the contact electrode (the second oxide) is formed over the nitride. Heretofore, formation of the second oxide over doped poly (without the nitride) resulted non-conformal oxide formation due to the enhanced oxidation regions over the grain boundaries of the poly. The present nitride layer prevents the diffusion of boundary impurities from the gate poly. The resulting second oxide is conformal, without thin breakdown regions. The conventional high oxidation temperature for poly on poly is no longer required to obtain conformal oxide. The low oxidation temperatures permitted by the nitride cause less dopant redistribution.

FLOATING GATE

(FIG. 5)

A specific method of growing high quality silicon oxide over poly gate material using a silicon nitride diffusion stop is described in STEPS 5-A to 5-K below and shown in corresponding FIGS. 1-A to 1-F and 5.

STEP (5-A-1) Providing a suitable single crystal silicon support host 510 (similar to STEP 1-A).

STEP (5-B) Forming a first silicon nitride layer 520 over support host 510 (similar to STEP 1-B).

STEP (5-C) Forming a first poly-crystalline silicon layer (undoped) over nitride 520 (similar to STEP 1-C).

STEP (5-D) Oxidizing first poly silicon layer forming first oxide layer 540 by elevated temperature and oxygen exposure conditions (similar to STEP 1-D). First oxide 540 forms the first dielectric of the gate, and has a variable thickness requirement. For EEPROM tunneling devices, first oxide 540 may be as thin as 100 Angstorms. For EPROMs and other gates, oxide 540 may be from 200 to 400 Angstroms.

STEP (5-E) Continuing the oxidation of poly 530 (similar to STEP 1-E).

STEP (5-F-1) Driving the oxidation of oxide 540 (similar to STEP 1-F-1).

STEP (5-F-2) Saturating the oxidation within oxide layer 540 (similar to STEP 1-F-2).

STEP (5-G) Forming doped poly 550 over oxide 540 to form the floating gate material. Gate poly 550 may be as thick as 2,500 Angstroms depending on the application.

STEP (5-H) Forming a second silicon nitride layer 560 over gate poly 550 (similar to STEP 1-B). Nitride 560 is vapor deposited, and is therefore conformal to the grain irregularities in the surface of gate poly 550.

STEP (5-I-1) Forming a second poly-crystalline silicon layer (undoped) over second nitride 560 by conventional deposition (similar to STEP 1-C). The second poly is conformal to nitride 560.

STEP (5-I-2) Oxidizing the second poly to form second oxide 570 by elevated temperature and oxygen exposure conditions (similar to STEP 1-D). Heretofore, the oxidation of undoped poly over doped poly resulted in nonconformal oxidation due to dopant enhanced oxidation over the grain boundaries. The presence of nitride 520 prevents impurities in gate poly 550 from affecting the oxidation rate in second oxide 570; and the oxidation is conformal. The thickness of second oxide 570 is uniform, even though the surface is not flat.

STEP (5-J) Continuing the oxidation of the second poly (similar to Step 1-E).

STEP (5-K-1) Driving the oxidation of oxide 570 (similar to STEP 5-F-1).

STEP (5-K-2) Saturating the oxidation within oxide layer 570 (similar to STEP 5-F-2).

MNOS EMBODIMENT

(FIG. 6)

Figure 6:
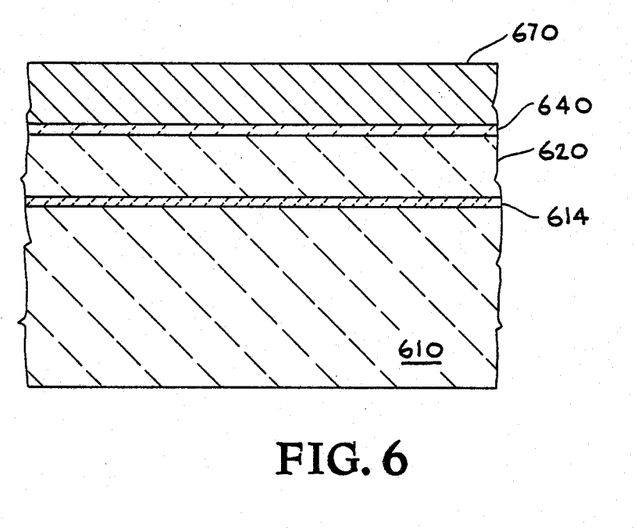
FIG. 6 shows an MNOS embodiment of the method of FIG. 1.

Nitride formed by LPCVD function as diffusion barriers to prevent oxidation of the underlying substrate material. FIG. 6 shows an MNOS device with nitride 620 deposited on silicon host 610 forming a floating gate. The thin dielectric between substrate 610 and nitride 620 is silicon oxide 614. The dielectric between nitride 620 and contact electrode 670 is silicon oxide 640. During the formation of oxide 640 from poly, nitride 620 prevents the oxidation of host 610. Heretofore, the second dielectric was formed by oxidizing the silicon nitride at a high temperature (1,000 degrees C.), which degraded the floating gate nitride.

INDUSTRIAL APPLICABILITY

It will be apparent to those skilled in the art that the objects of this invention have been achieved as described hereinbefore by using a silicon nitride diffusion stop. The nitride prevents advance of the oxide into the substrate, and creates a non-critical oxidation environment. The thickness of the oxide formed is not critically dependent on either time or temperature. The oxidation period may be extended to convert essentially all of the poly to oxide and to perfect the chemical bonds within the oxide. The nitride minimizes impurity out diffusion and boundary dopant segregation. The substrate may be single crystal silicon, or poly crystalline silicon. When oxidizing poly on poly, the nitride prevents grain boundary impurities in the underlying poly from affecting the oxidation rate in the oxidizing poly. The impurities can not diffuse through the nitride into the oxidizing poly. The resulting oxide is conformal to the underlying poly without thin breakdown regions. The conventional high oxidation temperature is no longer required to obtain high quality oxide. The lower oxidation temperatures permitted by the nitride cause less dopant redistribution. The nitride minimizes trench corner stress by isolating the substrate from the oxidation.

CONCLUSION

The foregoing description of the preferred embodiments of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchagable with other steps in order to achieve the same result. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

I claim as my invention:

1. A method of forming high quality silicon oxide, comprising the steps of:
providing a host support;
forming silicon nitride on the host support;
forming silicon material on the silicon nitride; and
oxidizing the silicon material in an atmosphere comprising dry oxygen gas to form a silicon oxide, comprising the sub-steps of:
continuing the oxidation process until the oxide-silicon interface reaches the silicon nitride, and
saturating the oxidation reaction within the silicon oxide to perfect loose chemical bonds between the silicon and the oxygen in the silicon oxide.

2. The method of claim 1, wherein said oxidizing step further comprises the sub-step of:
driving the oxidation process within the silicon material to completion to convert essentially all of the silicon material to silicon oxide.

3. The method of claim 1, wherein:
said oxidizing step further comprises the sub-steps of:
elevating the temperature of the silicon material to a temperature sufficient to support the oxidation reaction between oxygen and silicon and to permit the diffusion of oxygen therethrough, and
exposing the surface of the silicon material to oxygen which reacts with the surface silicon material forming silicon oxide and diffuses through the silicon oxide to progressively oxidize the silicon material from the surface inward defining an oxide-silicon interface; and
said temperature elevating sub-step includes a temperature cycle comprising a warm up period of generally increasing temperature, a main period of generally steady temperature, and a cool down period of generally decreasing temperature.

4. The method of claim 3, wherein said oxidizing step comprises exposing the silicon material to oxygen prior to the initiation of the main period of the temperature cycle.

5. The method of claim 3, wherein said oxidizing step comprises exposing the silicon material to oxygen after the termination of the main period of the temperature cycle.

6. The method of claim 1, wherein the silicon nitride means is the compound formed by three atoms of silicon and four atoms of nitrogen.

7. The method of claim 1, wherein the silicon nitride means is a single layer of silicon nitride between the host support means and the silicon material.

8. The method of claim 1, wherein the silicon nitride means is formed at an elevated deposition temperature by low pressure chemical vapor deposition from a vapor containing silicon and nitrogen.

9. The method of claim 1, wherein the host support means is silicon and the silicon nitride means thereon is thermal nitride grown on the host silicon during a growing period at an elevated growth temperature by decomposing a nitrogen bearing gas.

10. The method of claim 9, wherein the nitrogen bearing gas is ammonia.

11. The method of claim 9, wherein the thickness of the grown silicon nitride on the host silicon is limited by the growth temperature.

12. The method of claim 11, wherein the minimum growth temperature is determined by the threshold reacting temperature of silicon and nitrogen.

13. The method of claim 11, wherein the thickness uniformity of the grown silicon nitride is improved by extending the silicon nitride growing period.

14. The method of claim 1, wherein the host support means is single crystal silicon.

15. The method of claim 1, wherein the host support means is poly crystalline silicon and the nitride prevents diffusion of impurities from the host poly crystalline silicon into the silicon oxide during oxidation.

16. A method of filling a trench with silicon oxide, comprising the steps of:
(a) providing a host support;
(b) forming a trench in the host support, the trench having opposed side walls and a bottom wall;
(c) forming silicon nitride means in the trench and on the host support;
(d) forming silicon material on the silicon nitride;
(e) oxidizing the silicon material to form silicon oxide and continuing the oxidation process until the oxide-silicon interface reaches the silicon nitride causing the silicon material to merge into the silicon oxide;
(f) forming a layer of polycrystalline silicon over the silicon oxide; and
(g) oxidizing the polycrystalline silicon to fill the isolation trench with silicon oxide.

17. The method of claim 16, wherein said oxidation step (e) comprises:
driving the oxidation process within the silicon material to completion to convert essentially all of the silicon material to silicon oxide.

18. The method of claim 17, wherein said oxidizing step (e), comprises:
saturating the oxidation reaction within the silicon oxide to perfect substantially all loose chemical bonds between the silicon and the oxygen in the silicon oxide.

19. The method of claim 16, wherein:
said oxidizing step (e) comprises:
evaluating the temperature of the silicon material to a temperature sufficient to support the oxidation reaction between oxygen and silicon and to permit the diffusion of oxygen therethrough, and
exposing the surface of the silicon material to oxygen which reacts with the surface silicon material forming silicon oxide and diffuses through the silicon oxide to progressively oxidize the silicon material from the surface inward; and
said temperature elevating includes a temperature cycle comprising a warm up period of generally increasing temperature, a main period of generally steady temperature, and a cool down period of generally decreasing temperature.

20. The method of claim 19, wherein said oxidizing step (e) comprises exposing the silicon material to oxygen prior to the start of the main period of the temperature cycle.

21. The method of claim 19, wherein said oxidizing step (e) comprises exposing the silicon material to oxygen after the termination of the main period of the temperature cycle.

22. The method of claim 16, wherein the host support means is silicon and the silicon nitride means thereon is thermal nitride grown on the host silicon during a growing period at an elevated growth temperature by decomposing ammonia gas.

23. The method of claim 22, wherein the thickness of the grown silicon nitride on the host silicon is limited by the growth temperature.

24. The method of claim 22, wherein the thickness uniformity of the grown silicon nitride is improved by extending the silicon nitride growing period.

25. The method of claim 16, wherein the silicon material is a thin layer of undoped poly crystalline silicon.

26. The method of claim 16, wherein the support host means is single crystal silicon and the trench means is an isolation trench etched in the single crystal silicon.

27. The method of claim 16, further comprising the step of:
etching the polycrystalline silicon away from the bottom wall of the isolation trench prior to said step (g).

28. The method of claim 21, wherein the silicon oxide formed over the nitride means functions as an etch stop for removing the poly crystalline silicon from the bottom wall of the isolation trench.

29. The method of claim 16, wherein the support host means is single crystal silicon and the trench means is a storage capacitor trench etched in the single crystal silicon.

30. The method of claim 29, further comprising the step of:
filling the storage capacitor trench with doped polycrystalline silicon.

31. A method of manufacturing a floating gate device, comprising the steps of:
providing a host silicon;
forming a first silicon nitride layer on the host silicon;
forming first silicon material on the first silicon nitride layer;
oxidizing the first silicon material to form a first silicon oxide dielectric, comprising the sub-steps of:
continuing the oxidation process forming the first silicon oxide dielectric layer until the first oxide-silicon interface reaches the first silicon nitride layer causing the first silicon material to merge into the first silicon oxide dielectric, and
saturating the oxidation reaction within the silicon oxide to perfect loose chemical bonds between the silicon material and oxygen;
providing doped poly silicon gate material over the first silicon oxide dielectric;
forming a second silicon nitride layer on the poly silicon gate material;
forming second silicon material on the second silicon nitride layer; and
oxidizing the second silicon material to form a second silicon oxide dielectric layer, comprising the sub-steps of:
continuing the oxidation process forming the second silicon oxide dielectric layer until the second oxide-silicon interface reaches the second silicon nitride layer causing the second silicon material to merge into the second silicon oxide dielectric, and
saturating the oxidation reaction within the silicon oxide to perfect loose chemical bonds between the silicon material and the oxygen.

32. The method of claim 31, wherein said steps of oxidizing the first and second silicon materials each comprise the sub-step of:
driving the oxidation process within the silicon material to completion to converting essentially all of the silicon material to silicon oxide.

33. The method of claim 32, wherein:
said steps of oxidizing the first and second silicon materials each comprise the sub-steps of:
elevating the temperature of the first silicon material to a temperature sufficient to support the oxidation reaction between oxygen and silicon and to permit the diffusion of oxygen therethrough, and
exposing the surface of the first silicon material to oxygen which reacts with the surface silicon of the first silicon material forming silicon oxide and diffuses through the silicon oxide to progressively oxidize the first silicon material from the surface inward defining a first oxide-silicon interface; and
said temperature elevating sub-steps each include a temperature cycle comprising a warm up period of generally increasing temperature, a main period of generally steady temperature, and a cool down period of generally decreasing temperature.

34. The method of claim 33, wherein each said oxidizing step comprises exposing the silicon material to the dry oxygen gas prior to the start of the main period of the termpature cycle.

35. The method of claim 33, wherein each said oxidizing step comprises exposing the silicon material to the dry oxygen gas after the termination of the main period of the temperature cycle.

36. The method of claim 31, wherein the host support means is silicon and the silicon nitride means thereon is thermal nitride grown on the host silicon during a growing period at an elevated growth temperature by decomposing ammonia gas.

37. The method of claim 36, wherein the thickness of the grown silicon nitride on the host silicon is limited by the growth temperature.

38. The method of claim 37, wherein the thickness uniformity of the grown silicon nitride is improved by extending the silicon nitride growing period.

39. A method of fabricating a floating gate device, comprising the steps of:
(a) providing a substrate;
(b) providing a first oxide layer on the substrate;
(c) providing a gate material on the first oxide layer;
(d) providing a silicon nitride layer on the gate material;
(e) providing silicon material on the silicon nitride layer; and
(f) oxidizing the silicon material and saturating the oxidation reaction within the oxidized silicon material to perfect substantially all loose chemical bonds between the silicon material and oxygen.

40. A method of fabricating a floating gate device according the claim 39, wherein said oxidizing step (f) comprises converting essentially all of the silicon material to an oxide of silicon.

41. A method of fabricating a floating gate device according to claim 40, wherein said oxidizing step (f) comprises providing an oxide of silicon suitable for an active element in a semiconductor device.

42. A method of fabricating a floating gate device according to claim 41, wherein said oxidizing step (f)

comprises oxidizing the silicon material in an atmosphere comprising dry oxygen gas.

43. A method of filling a trench with silicon oxide, comprising the steps of:
  (a) providing a substrate;
  (b) providing a trench in the substrate;
  (c) providing a silicon nitride layer in the trench;
  (d) providing polycrystalline silicon on the silicon nitride layer; and
  (e) oxidizing the polycrystalline silicon to fill the trench with silicon oxide and continuing the oxidation process until substantially all of the silicon material is converted to silicon oxide.

44. A method of filling a trench with silicon oxide according to claim 43, further comprising the steps of:
  providing silicon material on the silicon nitride layer after said step (c); and
  oxidizing the silicon material to form a silicon oxide layer and continuing the oxidation process until substantially all of the silicon material is converted to silicon oxide prior to said step (d);
  wherein said step (d) comprises providing the polycrystalline silicon on the silicon oxide layer.

45. A method of filling a trench with silicon oxide according to claim 44, wherein the trench has side walls and a bottom, further comprising the step of etching the polycrystalline silicon away from the bottom of the trench prior to said step (e).

* * * * *